(12) United States Patent
Sun et al.

(10) Patent No.: US 11,821,942 B2
(45) Date of Patent: Nov. 21, 2023

(54) APPARATUS AND METHOD FOR PROBING DEVICE-UNDER-TEST

(71) Applicant: Taiwan Semiconductor Manufacturing Company, Ltd., Hsinchu (TW)

(72) Inventors: Chuan-Hsiang Sun, Taoyuan (TW); Bo-You Chen, Hsinchu (TW); Chi-Chang Lai, Taichung (TW); Hsiou-Yu He, Hsinchu (TW); Peiwei Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 86 days.

(21) Appl. No.: 17/461,961

(22) Filed: Aug. 30, 2021

(65) Prior Publication Data
US 2023/0068552 A1    Mar. 2, 2023

(51) Int. Cl.
| G01R 1/02 | (2006.01) |
|---|---|
| G01R 1/04 | (2006.01) |
| G01R 1/067 | (2006.01) |
| G01R 1/073 | (2006.01) |
| G01R 1/44 | (2006.01) |
| G01R 31/00 | (2006.01) |
| G01R 31/20 | (2006.01) |
| G01R 31/26 | (2020.01) |
| G01R 31/28 | (2006.01) |

(52) U.S. Cl.
CPC ..... *G01R 31/2889* (2013.01); *G01R 1/06772* (2013.01)

(58) Field of Classification Search
CPC . G01R 1/02; G01R 1/04; G01R 1/067; G01R 1/06772; G01R 1/073; G01R 1/44; G01R 31/00; G01R 31/02; G01R 31/20; G01R 31/26; G01R 31/28
See application file for complete search history.

(56) References Cited

U.S. PATENT DOCUMENTS

| 9,823,272 | B2* | 11/2017 | Chen | G01R 1/0735 |
|---|---|---|---|---|
| 2012/0313659 | A1* | 12/2012 | Hsu | G01R 1/07314 |
| | | | | 324/755.05 |
| 2015/0192609 | A1* | 7/2015 | Hsu | G01R 31/2601 |
| | | | | 324/754.03 |

* cited by examiner

*Primary Examiner* — Neel D Shah
(74) *Attorney, Agent, or Firm* — JCIPRNET

(57) ABSTRACT

An apparatus for probing a device-under-test (DUT) includes a fixture disposed over the DUT, a circuitry film disposed along a contour of the fixture, a first signal connector, and a plurality of probing tips disposed on the circuitry film and extending toward the device-under-test. The circuitry film includes a first portion attached to a top sidewall of the fixture, and the first signal connector is disposed on and electrically connected to the first portion of the circuitry film. The first signal connector is electrically coupled to the probing tips through the circuitry film. A method for probing a DUT is also provided.

20 Claims, 8 Drawing Sheets

APPARATUS AND METHOD FOR PROBING DEVICE-UNDER-TEST

BACKGROUND

With the evolving of semiconductor technologies, integrated circuit (IC) devices get smaller and the functionalities continue to increase. The testing of the IC devices plays an important role in IC manufacturing to ensure the functionalities of the IC devices. Typically, the prober station is configured to provide the testing signals for a device-under-test (DUT) via the probe card which includes a probe head connected to a printed circuit board (PCB). Although existing methods and apparatus of testing have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
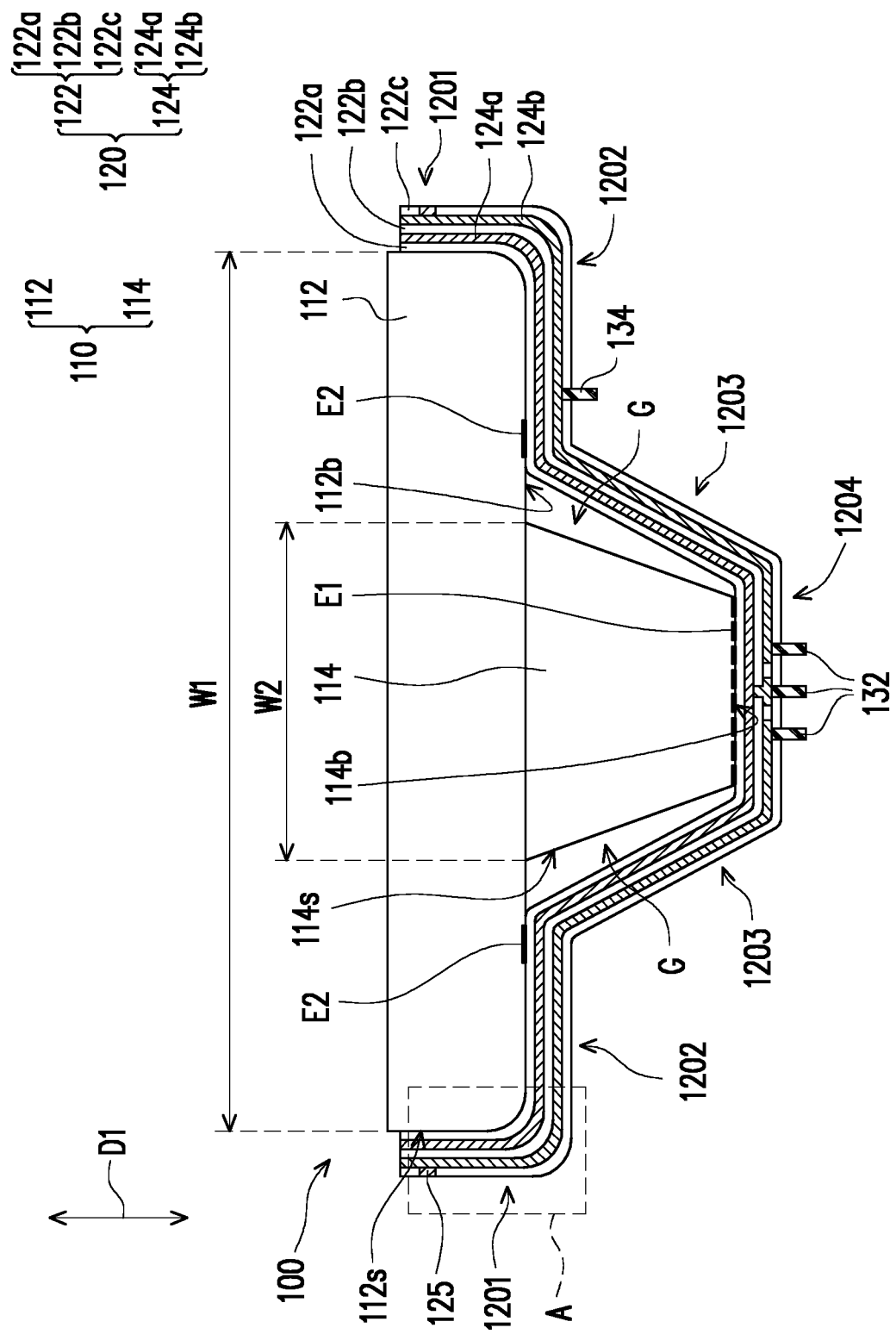
FIGS. 1-4 are schematic cross-sectional views showing various stages in a manufacturing method of a probing apparatus according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
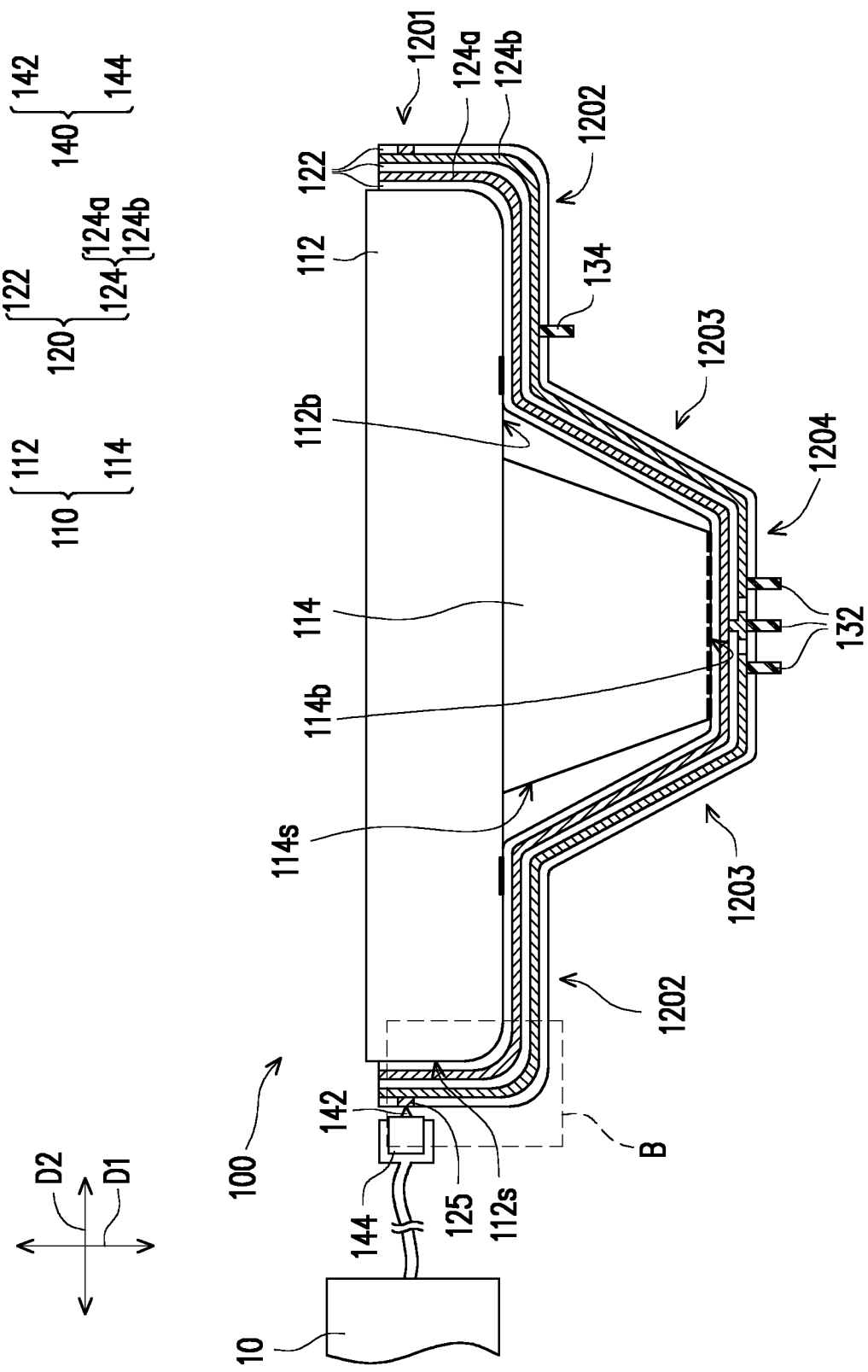
Figure 3:
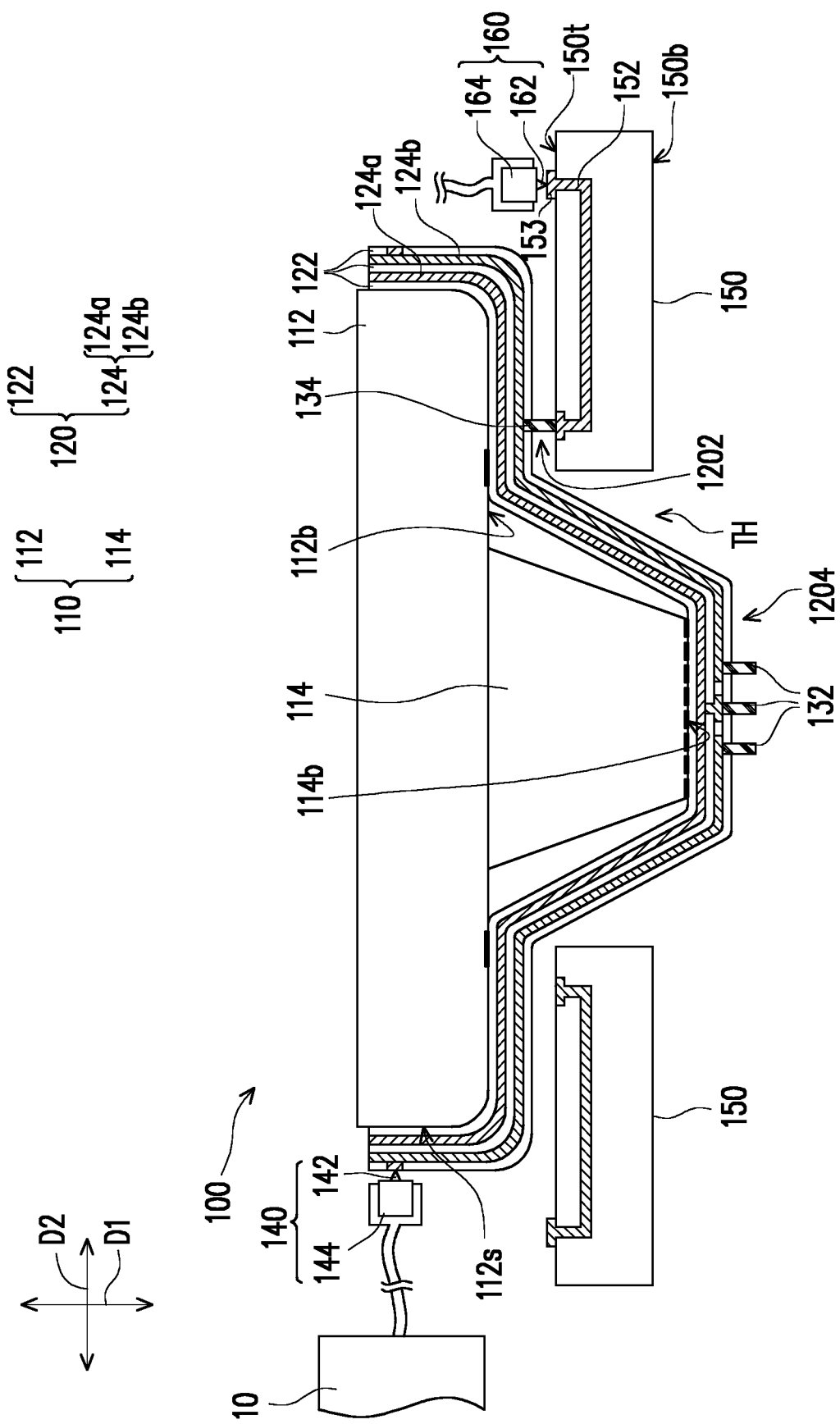
Figure 4:
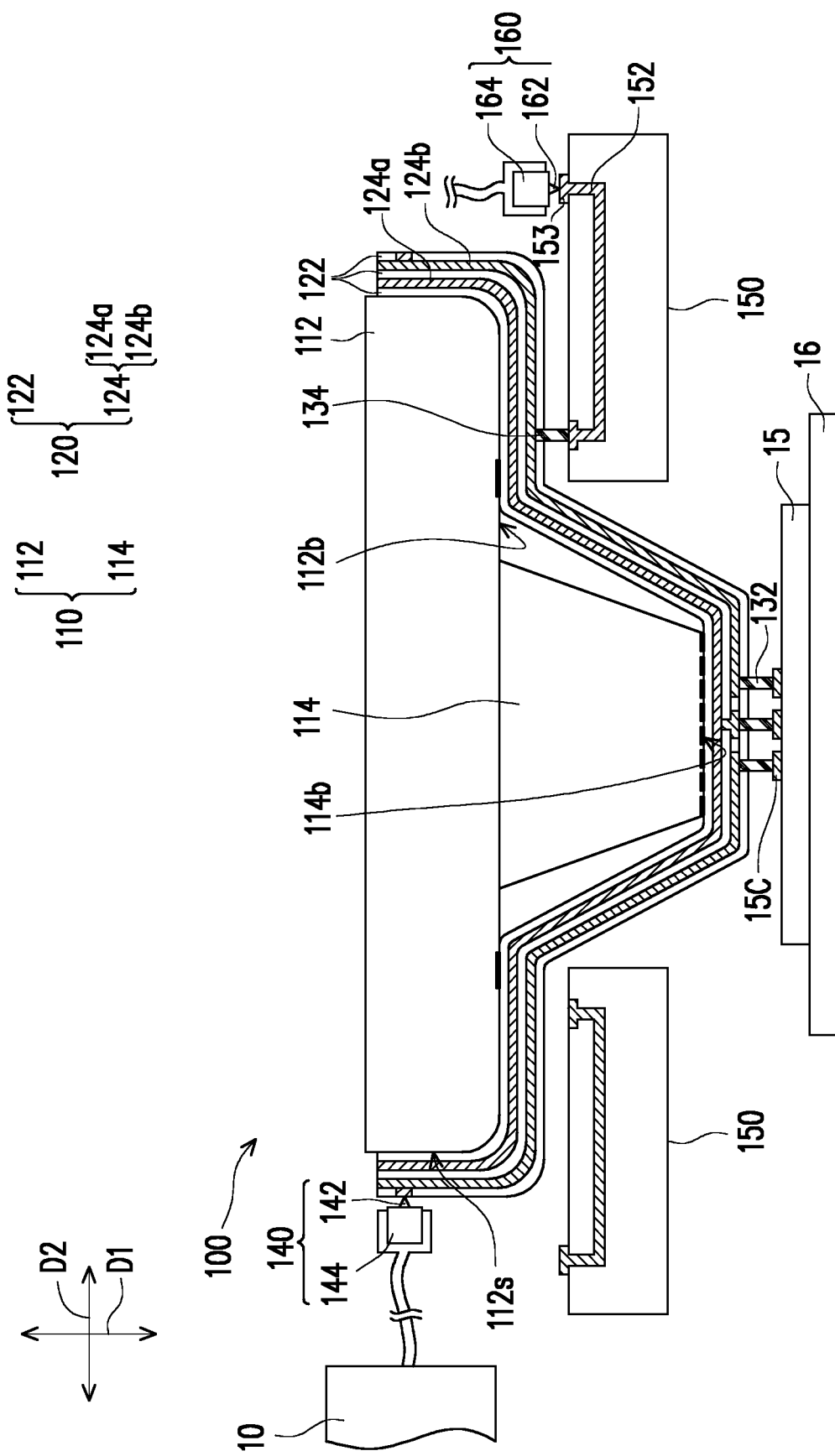
Figure 5A:
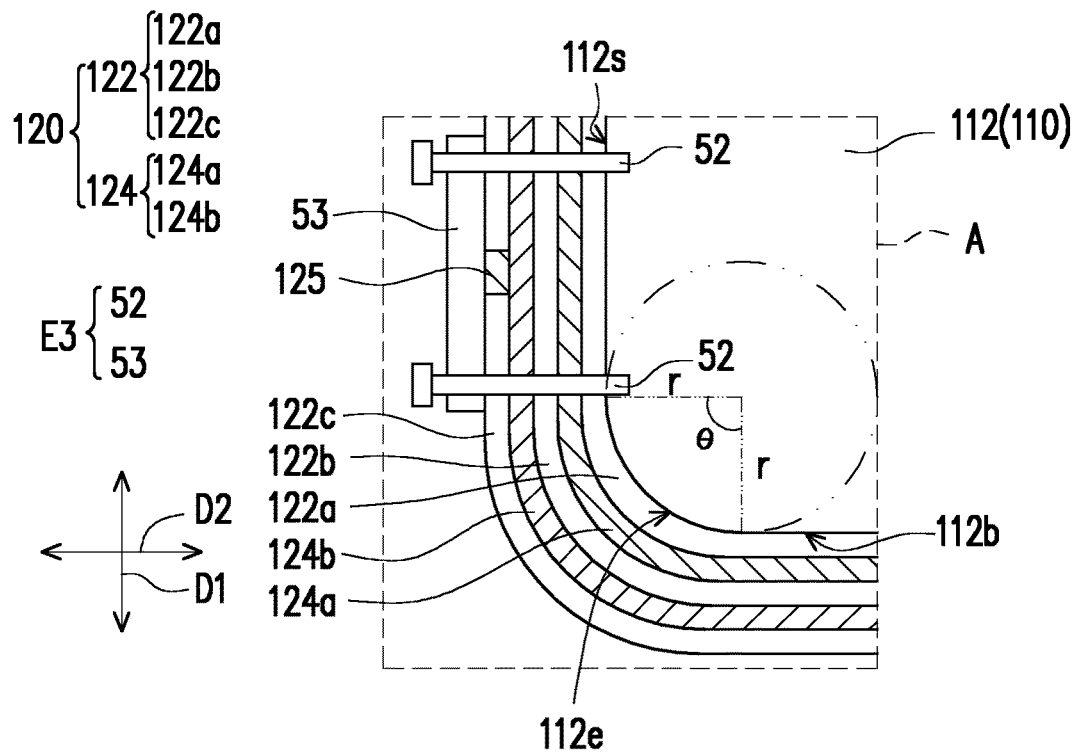
FIG. 5A is a schematic and enlarged cross-sectional view showing a dashed box A outlined in FIG. 1 according to some embodiments.
Figure 5B:
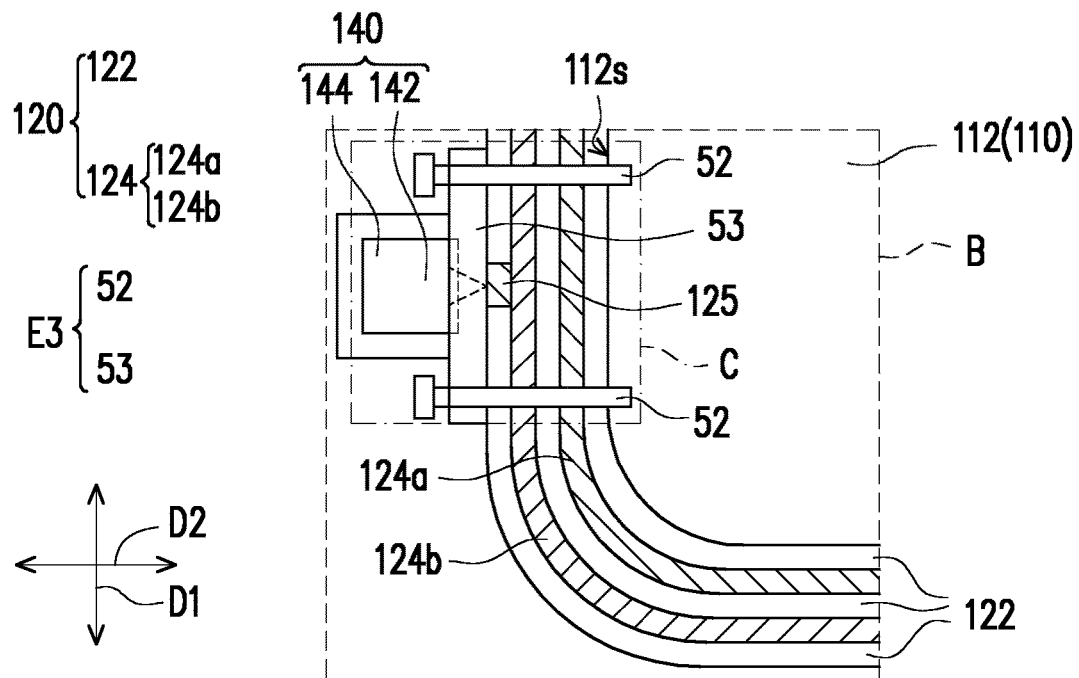
FIG. 5B is a schematic and enlarged cross-sectional view showing a dashed box B outlined in FIG. 2 according to some embodiments.
Figure 6:
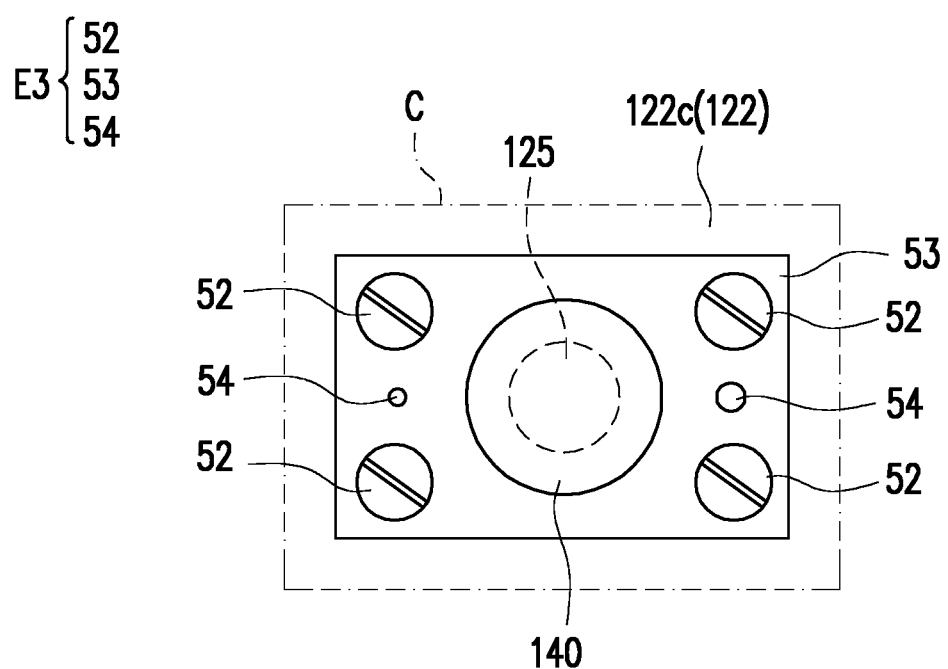
FIG. 6 is a schematic and enlarged left-side view showing a dashed box C outlined in FIG. 5B according to some embodiments.
Figure 7:
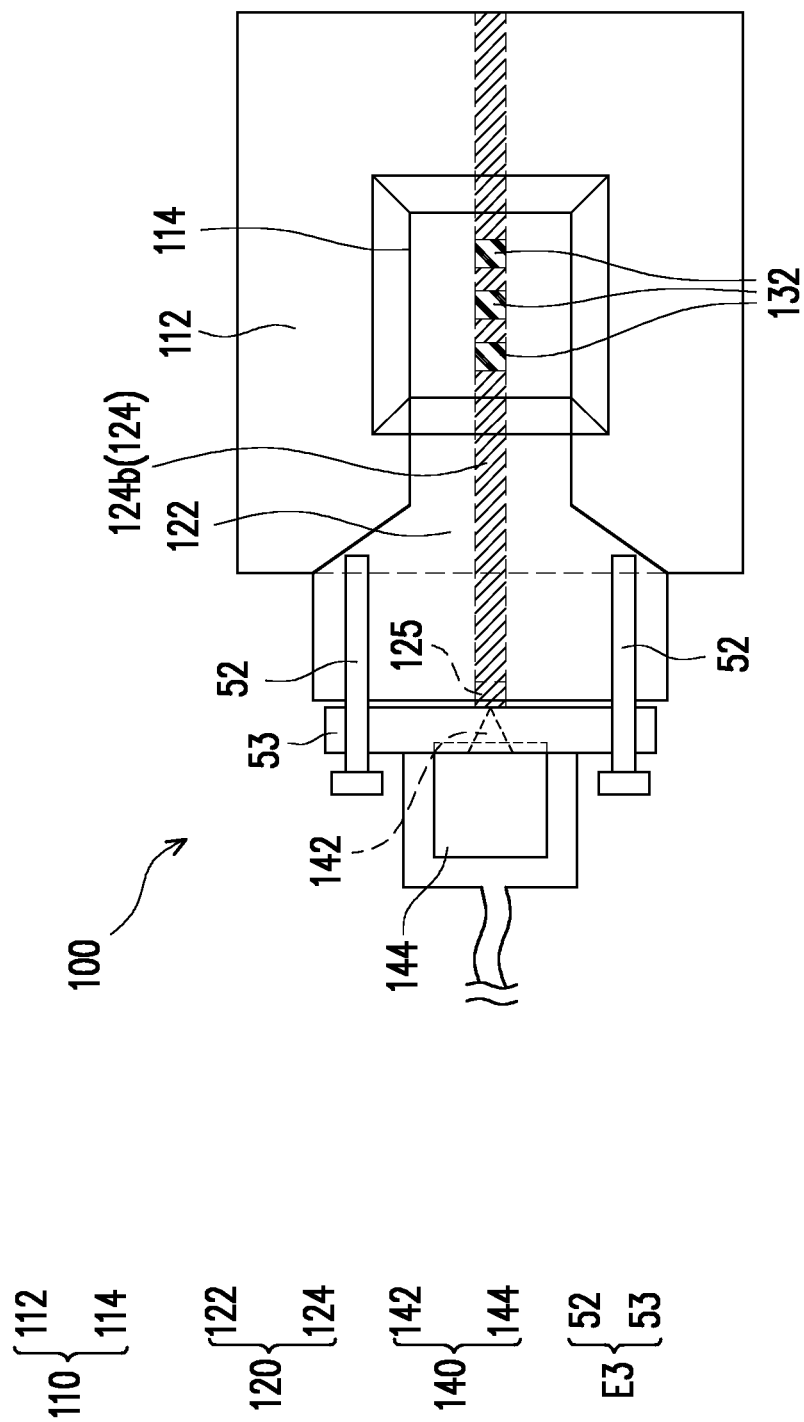
FIG. 7 is a schematic bottom view of a probing apparatus in FIG. 2 according to some embodiments.

FIGS. 1-4 are schematic cross-sectional views showing various stages in a manufacturing method of a probing apparatus according to some embodiments, FIG. 5A is a schematic and enlarged cross-sectional view showing a dashed box A outlined in FIG. 1 according to some embodiments, FIG. 5B is a schematic and enlarged cross-sectional view showing a dashed box B outlined in FIG. 2 according to some embodiments, FIG. 6 is a schematic and enlarged left-side view showing a dashed box C outlined in FIG. 5B according to some embodiments, and FIG. 7 is a schematic bottom view of a probing apparatus in FIG. 2 according to some embodiments. Unless specified otherwise, like reference numbers are used to designate like elements throughout the drawings.

Referring to FIG. 1, a probing apparatus 100 includes a fixture 110 and a circuitry film 120 attached to the fixture 110. In some embodiments, the fixture 110 includes a base 112 and a protrusion 114 connected to the base 112. The fixture 110 may be hollow or may be solid. For example, the base 112 serving as a support element is formed of rigid material such as metal, hard dielectrics, suitable incompressible materials, combinations thereof, etc. In some embodiments, the base 112 provides a grounding path for a device-under-test (DUT). In some embodiments, the protrusion 114 is formed of insulating material, composite material including polymer and metal, and/or the like. The protrusion 114 may extend from the bottom surface 112b of the base 112 in a first direction D1. For ease of description, and without intending the structures disclosed herein to be limited to any particular orientation, the first direction D1 may be referred to as the Z direction or the height direction. For example, the protrusion 114 extends downward from the bottom surface 112b of the base 112 in an inclined manner. For example, the sidewalls 114s of the protrusion 114 are tilted from the base 112. In some embodiments, the protrusion 114 is in the shape of an inverted trapezoid seen from the cross-sectional view. Alternatively, the cross-section of the protrusion 114 may be a U-shape, a rectangular shape, a square shape, and/or the like. The base 112 may be wider than the protrusion 114. For example, the width W1 of the bottom surface 112b of the base 112 is greater than the top width W2 of the protrusion 114. A portion of the bottom surface 112b of the base 112 is unmasked by the protrusion 114.

The circuitry film 120 includes a dielectric layer 122 and at least one circuit layer 124, where the circuit layer 124 is embedded in the dielectric layer 122 and carries signals. In some embodiments, the circuitry film 120 includes a plurality of dielectric layers (122a, 122b, and 122c) and a plurality of circuit layers (124a and 124b) alternately stacked upon one another. It is noted that that three dielectric layers and two circuit layers are shown for illustrative purpose only, and the number of the dielectric layer and the circuit layer construes no limitation in the disclosure. For example, the dielectric layers (122a, 122b, and 122c) include suitable insulating material such as an epoxy, polyimide, benzocyclobutene, polybenzoxazole, combinations thereof, and/or the like. Although other dielectric materials may also be used. For example, conductive materials of the circuit layers (124a and 124b) include copper, aluminum, gold, metal alloys, combinations thereof, and/or the like.

Although other metallic materials having good electrical conductivities may also be used.

The circuit layer 124 includes conductive lines, conductive vias, conductive pads, etc. In some embodiments, the circuit layers (124a and 124b) include transmission lines (e.g., power lines, ground lines, radio frequency (RF) signal lines, I/O pads, and/or the like). In some embodiments, the transmission lines carrying RF signals (or called RF signal lines) are arranged at the circuit layer 124b and/or the circuit layer 124a. In some embodiments, the RF signal lines are only arranged at the outermost circuit layer 124b for conveying high frequency signals. For example, the high frequency range used herein may span from about 60 GHz to about 110 GHz. The circuit layer 124a between the outermost circuit layer 124b and the fixture 110 may (or may not) include RF signal lines for conveying relatively low frequency signals. The transmission lines carrying power signals (or called power signal lines) are arranged at the circuit layer 124a which is between the fixture 110 and the outermost circuit layer 124b. The transmission lines carrying ground signals (or called ground signal lines) are arranged at the circuit layer 124a and/or the circuit layer 124b. In some embodiments, the outermost circuit layer 124b includes the RF signal lines and the ground signal lines and may be free of the power signal lines. Other signal lines arrangement may be possible depending on testing requirements.

With continued reference to FIG. 1, the circuitry film 120 may be thin and mechanically flexible. In some embodiments, when attaching to the fixture 110, the circuitry film 120 is bended to substantially fit a contour of the fixture 110. For example, the circuitry film 120 includes first portions 1201 attached to the sidewalls 112s of the base 112, and second portions 1202 connected to the first portion 1201 and extending to underlie the portion of the bottom surface 112b of the base 112 that is not covered by the protrusion 114. The circuitry film 120 may include third portions 1203 connected to the second portions 1202 and extending along the sidewalls 114s of the protrusion 114, and fourth portions 1204 connected to the third portions 1203 and extending to underlie the bottom surface 114b of the protrusion 114. The top surface of the base 112 may be exposed by the circuitry film 120. As shown in FIG. 1, the circuitry film 120 may include six turning segments, for example, the first turning segment connecting the first portion 1201 to the second portion 1202, the second turning segment connecting the second portion 1202 to the third portion 1203, the third turning segment connecting the third portion 1203 to the fourth portion 1204, the fourth turning segment connecting the fourth portion 1204 to the third portion 1203, the fifth turning segment connecting the third portion 1203 to the second portion 1202, and the sixth turning segment connecting the second portion 1202 to the first portion 1201.

In some embodiments, the circuitry film 120 does not fully match the shape of the fixture 110. For example, the gap G may (or may not) be formed between the sidewalls 114s of the protrusion 114 and the third portions 1203 of the circuitry film 120. In some embodiments, a first engaging mechanism E1 and a second engaging mechanism E2 are respectively disposed on the bottom surface 114b of the protrusion 114 and the bottom surface 112b of the base 112 for coupling the circuitry film 120 to the fixture 110. The first engaging mechanism E1 and the second engaging mechanism E2 may be or may include adhesive, mechanically securing elements (e.g., fasteners, screws, pins, rivets, etc.), or other suitable engaging means. In some embodiments, the first engaging mechanism E1 is an adhesive and acts as a buffer layer interposed between the circuitry film 120 and the protrusion 114 of the fixture 110. In some embodiments, the second engaging mechanism E2 includes screws and corresponding nuts for affixing the circuitry film 120 to the base 112 of the fixture 110. Other arrangements may be possible depending on the requirements.

As shown in FIG. 1, the probing apparatus 100 includes a plurality of probing tips 132 electrically coupled to the circuitry film 120. In some embodiments, the probing apparatus 100 includes at least one signal connector 134 electrically coupled to the circuitry film 120. For example, the probing tips 132 are distributed on the fourth portion 1204 of the circuitry film 120 which extends across and underlies the bottom surface 114b of the protrusion 114. The signal connector 134 may be disposed on the second portion 1202 of the circuitry film 120 underlying the bottom surface 112b of the base 112. The respective probing tip 132 and the signal connector 134 may extend in the first direction D1. The signal connector 134 may be arranged to be coupled to the subsequently mounted circuit board (e.g., 150 in FIG. 3) for providing signal transmission. The probing tips 132 may be arranged based on the specific IC design of the device-under-test. In some embodiments, the probing tips 132 are referred to as needle tips.

In some embodiments, the signal connector 134 has a first end and a second end opposite to each other, where the first end is in physically contact with the circuitry layer 124 and the second end is configured to contact with a conductive contact on the circuit board as shown in FIG. 3. In some embodiments, the respective probing tip 132 has a first end and a second end opposite to each other, where the first end is in physically contact with the circuitry layer 124 of the circuitry film 120, and the second end is configured to contact with a contact point on the DUT as shown in FIG. 4. The probing tips 132 and the signal connector 134 may be similar in shape and/or size. The probing tips 132 and/or the signal connector 134 may have a cylinder shape with a rectangular cross-section. Alternatively, the cross-section of the probing tips 132 and/or the signal connector 134 may be a cone shape, an inverted triangular shape, and/or the like. In some embodiments, the bottom surface of the respective probing tip 132 has a square shape as shown in FIG. 7. Although the probing tips 132 and the signal connector 134 may have any desired bottom-view shape (e.g., circular shape, oval shape, triangular shape, rectangular shape, polygonal shape, etc.). It should be understood that the probing tips 132 and the signal connector 134 are given for illustrative purposes, and various numbers, shapes, and configurations are within the contemplated scope of the disclosure.

Still referring to FIG. 1 and with reference to FIG. 5A, the sidewall 112s and the bottom surface 112b of the base 112 are connected through a transitional edge 112e, in accordance with some embodiments. For example, the base 112 includes sharp top edges and round-shaped bottom edges. The transitional edge 112e may be or may include a curved edge (e.g., a round edge). As shown in FIG. 5A, the transitional edge 112e includes a curve connected to endpoints of the sidewall 112 and the bottom surface 112b seen from the cross-sectional view. The central angle θ may be subtended by an arc between the endpoints of the sidewall 112 and the bottom surface 112b, and the arc length may be the central angle θ of a circle of radius r. In some embodiments, the central angle θ is greater than 45 degrees. For example, the central angle θ is in a range of about 45 degrees and 270 degrees. In some embodiments, the transitional edge 112e is a chamfered edge (or a bevel edge), or the like. For example, the transitional edge 112e includes a slanted surface connected to endpoints of the sidewall 112 and the bottom surface 112b seen from the cross-sectional view. Although the transitional edge may have other arrangement(s). In some embodiments, the circuitry film 120 is capable of bending to fit the shape of the transitional edges 112e. The fixture 110 with the transitional edge 112e may reduce the likelihood of damage to the circuitry film 120 during assembling and/or probing the DUT.

With continued reference to FIGS. 1 and 5A, the circuitry film 120 underlying the bottom surface 112b of the fixture 110 may extend upward to cover the sidewall 112s of the fixture 110. The first portions 1201 of the circuitry film 120 covering the sidewall 112s of the base 112 include a conductive contact 125 accessibly exposed by the dielectric layer 122 (e.g., the outermost dielectric layer 122c) for further electrical connection. The conductive contact 125 may be or may include a pad, a pin, a terminal, and/or the like. In some embodiments, the conductive contact 125 is directly and electrically connected to the RF signal lines arranged at the circuit layer 124b for providing RF signal transmission.

In some embodiments, the first portions 1201 of the circuitry film 120 are detachably secured onto the sidewall 112s of the base 112 using a third engaging mechanism E3 for ease of maintenance. For example, the circuitry film 120 is replaced with another circuitry film to test different DUTs with different designs. The third engaging mechanism E3 may be or may include fasteners, screws, nuts, pins, rivets, and/or other suitable engaging means. For example, the third engaging mechanism E3 includes the fasteners 52 (e.g., screws and corresponding nuts) that are disposed around the conductive contact 125. For example, the fasteners 52 penetrate through the circuitry film 120 and may be inserted into the sidewall 112s of the base 112 of the fixture 110. The base 112 of the fixture 110 may include receiving holes for receiving the fasteners 52. For example, the receiving holes of the base 112 are threaded holes, and the fasteners 52 are engaged with the fixture 110 in a threaded manner. Other suitable engaging manner may be employed as long as the engaging mechanism may be stably engaged with the fixture. In some embodiments, the fasteners 52 are disposed along the second direction D2 as shown in FIG. 5A. In some embodiments, the third engaging mechanism E3 includes a tab 53 having receiving holes which function in the alignment and/or engagement of the fasteners 52 and the circuitry film 120. The third engaging mechanism E3 may include other elements as will be described later in accompanying with FIG. 6.

Referring to FIG. 2, a first signal coupling mechanism 140 including a signal connector 142 and a cable 144 is in physical and electrical contact with the conductive contact 125 of the circuitry film 120. In some embodiments in which the conductive contact 125 connecting to the RF signal lines, the first signal coupling mechanism 140 is referred to as the RF signal connector 140. The first signal coupling mechanism 140 may be adapted for routing signals to and from the tester 10. For example, the tester 10 is configured to generate test signals for testing the DUT and receive signals from the DUT in response to being tested. In some embodiments, the first signal coupling mechanism 140 is disposed along a second direction D2. For example, the signal connector 142 of the first signal coupling mechanism 140 is horizontally coupled to the circuitry film 120 as seen from the cross-sectional view. In some embodiments, the extending direction (e.g., the second direction D2) of the signal connector 142 is substantially perpendicular to the extending direction (e.g., the first direction D1) of the probing tips 132 and/or the signal connector 134. For example, the first direction D1 and the second direction D2 are substantially perpendicular to each other. For ease of description, and without intending the structures disclosed herein to be limited to any particular orientation, the second direction D2 may be referred to as the widthwise direction. It is understood that due to coupling process variations, the extending direction of the signal connector 142 may not be perpendicular to the sidewall of the base of the fixture.

With continued reference to FIG. 2 and also referring to FIGS. 5B and 6-7, the first signal coupling mechanism 140 is electrically coupled to the conductive contact 125 of the circuitry film 120. The signal connector 142 may be in contact with the conductive contact 125 through a joining process (e.g., soldering, bonding, or adhesive) or other suitable coupling techniques. In some embodiments, after coupling the signal connector 142 to the conductive contact 125, the testing signals generating from the tester 10 are transmitted to the DUT through the circuit layer 124 of the circuitry film 120 to test the functionality of the DUT. In some embodiments, the first signal coupling mechanism 140 is detachably connected to the conductive contact 125 for ease of maintenance. The tab 53 may be detachably interposed between the first signal coupling mechanism 140 and the circuitry film 120. For example, the tab 53 includes a hole accessibly exposing the conductive contact 125 of the circuitry film 120 for further coupling. In some embodiments, the signal connector 142 of the first signal coupling mechanism 140 passes through the hole of the tab 53 to be in contact with the conductive contact 125 of the circuitry film 120.

As shown the left-side view of FIG. 6, the fasteners 52 may be disposed at the corners of the connector area of the circuitry film 120. The third engaging mechanism E3 may include guide pins 54 arranged on the tab 53, where the guide pins 54 may be disposed at opposing sides of the first signal coupling mechanism 140 and between the adjacent fasteners 52. In some embodiments, a pair of the guide pins 54 is of different sizes to ensure foolproof alignment. Alternatively, the guide pins 54 have the same size. The third engaging mechanism E3 may include greater or fewer numbers of the guide pins 54. It should be understood that four fasteners and two guide pins shown in FIG. 6 are given for illustrative purposes, and various numbers, shapes, and configurations of the fasteners and guide pins are within the contemplated scope of the disclosure. In addition, it is appreciated that the third engaging mechanism E3 is not shown in other drawings for ease of illustration.

Referring to FIG. 3, the fixture 110 is attached to a circuit board 150. For example, the circuit board 150 is provided with a through hole TH. The base 112 of the fixture 110 is disposed above the top surface 150t of the circuit board 150 and across the through hole TH. The protrusion 114 of the fixture 110 may pass through the through hole TH. In some embodiments, the bottom surface 114b of the protrusion 114 extend lower than the bottom surface 150b of the circuit board 150, so that the probing tips 132 disposed on the fourth portion 1204 of the circuitry film 120 which underlies the bottom surface 114b of the protrusion 114 may probe the DUT without being interfered. In some embodiments, the base 112 of the fixture 110 is secured on the circuit board 150 by any suitable engaging mechanism (e.g., fasteners, screws, pins, rivets, clamps, etc.). For example, the base 112 of the fixture 110 includes receiving openings at desirable locations, so that screws may be screwed through the receiving openings of the fixture 110 to be affixed onto the circuit board 150. For example, the receiving openings of the base 112 are threaded opening, and the screws are engaged with the fixture 110 in a threaded manner. Other suitable engaging manner may be employed as long as the engaging mechanism may be stably engaged with the fixture.

The circuit board 150 may be or may include a printed circuit board (PCB) including a plurality of signal channels 152 to provide electrical interconnection. For example, the signal channels 152 include conductive lines, conductive pads, conductive vias, plated through holes, and/or the like. In some embodiments, the circuit board 150 is laminated with epoxy resin with the conductive layers formed therein, where the conductive layers may be formed from metal (e.g., copper foil) and may be patterned to form the signal channels 152. In some embodiments, after assembling the fixture 110 to the circuit board 150, the signal connector 134 on the second portion 1202 of the circuitry film 120 is in physical and electrical contact with the signal channel 152 of the circuit board 150. As shown in FIG. 3, the signal connector 134 may be disposed in the gap and extend between the base 112 of the fixture 110 and the circuit board 150 along the first direction D1.

In some embodiments, the signal channels 152 are electrically coupled to the conductive contact 153 for transmitting signals to/from the external device. For example, a second signal coupling mechanism 160 including a signal connector 162 and a cable 164 is electrically coupled to the conductive contact 153 disposed on the top surface 150t of the circuit board 150. In some embodiments, the second signal coupling mechanism 160 is disposed vertically relative to the top surface 150t of the circuit board 150 along the first direction D1. The signal connector 162 of the second signal coupling mechanism 160 may be in physical and electrical contact with the conductive contact 153 of the circuit board 150. The technique for coupling the signal connector 162 of the second signal coupling mechanism 160 to the conductive contact 153 of the circuit board 150 may be similar to the coupling technique for coupling the signal connector 142 of the first signal coupling mechanism 140 to the conductive contact 125 of the circuitry film 120.

In some embodiments, an extending direction (e.g., the first direction DO of the signal connector 162 of the second signal coupling mechanism 160 is different from the extending direction (e.g., the second direction D2) of the signal connector 142 of the first signal coupling mechanism 140. The extending direction of the signal connector 162, the extending direction of the probing tips 132, and the extending direction of the signal connector 134 may be substantially the same. In some embodiments, the second signal coupling mechanism 160 is coupled to the tester 10 for routing signals to and from the tester 10. For example, the signals to/from the tester 10 is transmitted via the second signal coupling mechanism 160, the circuit board 150, the signal connector 134, the circuit layer 124 of the circuitry film 120, and the probing tips 132. On the other hand, the first signal coupling mechanism 140 is not directly in electrical contact with the circuit board 150, and thus the signals to/from the tester 10 is transmitted via the first signal coupling mechanism 140, the circuit layer 124 of the circuitry film 120, and the probing tips 132.

It is understood that the impedance discontinuity decreases the quality of signals in the electronic device. By directly coupling the first signal coupling mechanism 140 to the conductive contact 125 of the circuitry film 120, the signal path between the tester 10 and the DUT is shortened, and the impedance discontinuity of the probing apparatus 100 may be reduced. In some embodiments, the electrically conductive path between the tester 10 and the probing tips 134 through the first signal coupling mechanism 140 provides RF signal transmission, and the second signal coupling mechanism 160 coupled to the conductive contact 153 of the circuit board 150 provides power/ground signal transmission. Although the first/second signal coupling mechanisms may provide other signal transmission.

Referring to FIG. 4, the probing tips 132 of the probing apparatus 100 are in physical and electrical contact with the contact points 15C of the DUT 15 for testing. In some embodiments, the DUT 15 is mounted on a chuck 16 for testing. For example, the chuck 16 which supports the DUT 15 is configured to move the DUT 15. The chuck 51 may be moved in any direction (e.g., x, y, z, tilt angle, etc.) through suitable moving mechanism (not shown) in order to bring the contact points 15C of the DUT 15 into engagement with the probing tips 132. The contact points 15C may be or may include contact pads, metal bumps, solder balls, etc. In some embodiments, the DUT 15 is a semiconductor wafer including a plurality of dies (not shown). The probing tips 132 may be in contact with the contact points 15C of each die of the semiconductor wafer for testing. For example, each of the dies includes an integrated circuit having electrical features coupled to form a functional circuit or an electrical device. The integrated circuit formed in the dies of the semiconductor wafer may include a FET, a memory device, a sensor, a high frequency device (e.g., blue tooth device, communication device), and/or the like.

Through the probing apparatus 100, the tester 10 is able to test the DUT 15. In some embodiments, the probing apparatus 100 provides an interface to couple the DUT 15 to the tester 10 through at least the signal coupling mechanisms 140 and 160. The probing apparatus 100 may be configured to provide the testing signals for the DUT 15. For example, the tester 10 includes an electric test circuit to provide testing signals and collect testing results from the DUT 15. In some embodiments, the tester 10 includes a computer-based control system to control the test and analyze test results. The probing apparatus 100 may be configured to test the DUT 15 at various stages for different purposes including acceptance test, characterization test, burn-in/stress test, production test, and/or the like.

As shown in FIG. 4, the circuit board 150 includes the signal channels 152 and the conductive contact 153 for electrically interconnecting the second signal coupling mechanism 160 and the signal connector 134, and thus the test signal generated by the tester 10 is transmitted to the DUT 15 through the second signal coupling mechanism 160, the circuit board 150, the signal connector 134, the circuitry film 120, and the probing tips 132. In some embodiments, via-connectors (e.g., the signal connector 134, the signal connector 162, and the probing tips 132) present discontinuities in impedance along the signal path between the tester 10 and the DUT 15. It is understood that such discontinuities may result in degradation in signal integrity, and these discontinuities may substantially affect the transmitting high frequency signals between signal traces on structures. For example, the need to transmit RF signals between various structures has necessitated the adequate configuration for reduction of the impedance discontinuities introduced by the via-connectors. In the illustrative embodiments, the first signal coupling mechanism 140 is directly connected to the circuitry film 120, and thus only two via-connectors (e.g., the signal connector 142 and the probing tips 132) present discontinuities in impedance along the signal path between the tester 10 and the DUT 15. By such configuration, RF signal transmission may exhibit improved performance, since the test signal generated by the tester 10 does not pass through the circuit board 150. In some embodiments, the more accurate measurement of the DUT high frequency response characteristics may be obtained.

Figure 8:
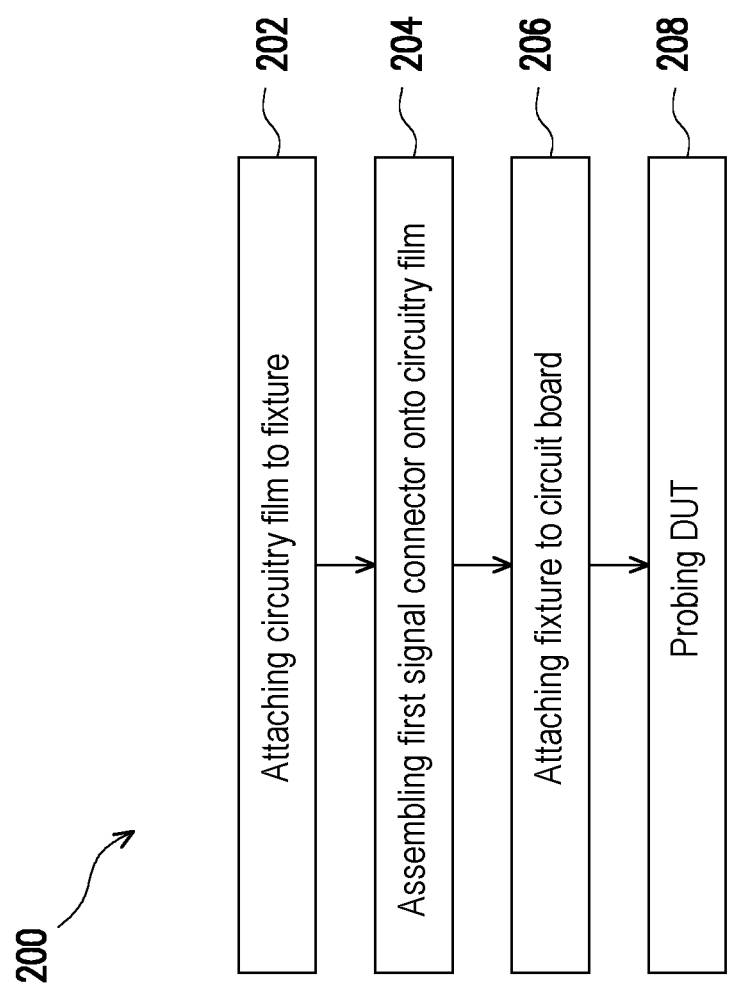
FIG. 8 is a flowchart of a manufacturing method of a probe apparatus for testing a device-under-test according to some embodiments.

FIG. 8 is a flowchart of a manufacturing method of a probe apparatus for testing a DUT according to some embodiments. It will be appreciated that although the method 20 is are illustrated and described below as a series of steps, the illustrated ordering of such steps are not to be interpreted in a limiting sense. For example, some steps occur in different orders and/or concurrently with other steps apart from those illustrated and/or described herein. In addition, not all illustrated steps are required to implement one or more aspects or embodiments of the description herein. Further, one or more of the steps depicted herein may be carried out in one or more separate acts and/or phases.

Referring to FIG. 8, at the step 202, the circuitry film is attached to the fixture. FIG. 1 show some embodiments corresponding to the step 202. For example, the circuitry film and the fixture are separately provided, and the circuitry film is fabricated based on the circuit design for testing. In some embodiments, the circuitry film is flexible and is bent to substantially fit the contour of the fixture in order to be attached onto the fixture. In some embodiments, the probing tips and signal connector are formed on the circuitry film during the fabrication of the circuitry film.

At the step 204, the first signal connector is assembled onto the circuitry film. FIG. 2 show some embodiments corresponding to the step 204. For example, the first signal coupling mechanism (e.g., 140 in FIG. 2) is laterally disposed and electrically coupled to the conductive contact on the first portion of the circuitry film which covers the sidewall of the base of the fixture. The signal connector of the first signal coupling mechanism is in physical and electrical contact with the conductive contact of the circuitry film to provide signal transmission (e.g., RF signal transmission).

At the step 206, the fixture is attached to the circuit board. FIG. 3 show some embodiments corresponding to the step 206. For example, the base of the fixture is secured on the circuit board, and the protrusion of the fixture passing through the through hole of the circuit board to present the probing tips in suitable position for probing, where the probing tips are arranged on the fourth portion of the circuitry film underlying the bottom surface of the fixture. In some embodiments, after attaching the fixture to the circuit board, the signal connector on the second portion of the circuitry film is in physical and electrical contact with the signal channel of the circuit board. In some embodiments, the second signal coupling mechanism (e.g., 160 in FIG. 3) including the signal connector and the cable is physically and electrically coupled to the circuit board to provide signal transmission to/from the probing tips through the signal connector (e.g., 134).

At the step 208, the probing tips probe the DUT. FIG. 4 show some embodiments corresponding to the step 208. For example, the DUT held by the chuck is moved to a suitable position, and the probing tips are aligned with the contact points of the DUT. Subsequently, the probing tips are in physical and electrical contact with the contact points of the DUT for testing. For example, in a testing procedure, the tester is configured to provide the testing signals for the DUT via the probing apparatus, and the probing tips are in electrically contact with the DUT for providing testing signals and collecting testing results.

In accordance with some embodiments, an apparatus for probing a device-under-test (DUT) includes a fixture disposed over the DUT, a circuitry film disposed along a contour of the fixture, a first signal connector, and a plurality of probing tips disposed on the circuitry film and extending toward the device-under-test. The circuitry film includes a first portion attached to a top sidewall of the fixture, and the first signal connector is disposed on and electrically connected to the first portion of the circuitry film. The first signal connector is electrically coupled to the probing tips through the circuitry film.

In accordance with some embodiments, an apparatus for probing a device-under-test (DUT) includes a fixture, a circuitry film attached to the fixture, a first signal connector, and a plurality of probing tips. The fixture includes a base and a protrusion, and the protrusion is connected to the base and extends toward the DUT. The circuitry film is attached to the fixture. The circuitry film includes a first portion extending along a sidewall of the base of the fixture, and a second portion extending across a bottom surface of the protrusion of the fixture. The first signal connector is disposed on and electrically connected to the first portion of the circuitry film. The probing tips are disposed on the second portion of the circuitry film to probe the DUT, and the first signal connector is electrically coupled to the probing tips through the circuitry film.

In accordance with some embodiments, a method for probing a device-under-test includes at least the following steps. A circuitry film is attached to a fixture, where the fixture includes a base and a protrusion connected to the base. A first signal connector is assembled onto a portion of the circuitry film that covers a sidewall of the base of the fixture. The fixture is attached to a circuit board, where the base of the fixture is disposed on the circuit board and the protrusion of the fixture passing through a through hole of the circuit board. The DUT is probed by a plurality of probing tips disposed on another portion of the circuitry film underlying the protrusion of the fixture.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for probing a device-under-test, comprising:
   a fixture disposed over the device-under-test;
   a circuitry film disposed along a contour of the fixture, and the circuitry film comprising a first portion attached to a top sidewall of the fixture;
   a first signal connector disposed on and electrically connected to the first portion of the circuitry film; and
   a plurality of probing tips disposed on the circuitry film and extending toward the device-under-test, and the first signal connector being electrically coupled to the probing tips through the circuitry film, wherein an extending direction of the first signal connector is different from an extending direction of the probing tips.

2. The apparatus of claim 1, wherein the extending direction of the first signal connector is substantially perpendicular to the extending direction of the probing tips.

3. The apparatus of claim 1, further comprising:
a second signal connector disposed on a second portion of the circuitry film that is connected to the first portion of the circuit film, wherein an extending direction of the first signal connector is different from that of the second signal connector.

4. The apparatus of claim 1, wherein:
the fixture comprises a top portion and a bottom portion protruding from the top portion,
the first portion of the circuitry film extends along the top sidewall of the top portion of the fixture, and
the probing tips are distributed on the circuitry film attached to a bottom surface of the bottom portion of the fixture.

5. The apparatus of claim 4, wherein the top portion of the fixture comprises a curved bottom edge, and the circuitry film is bended to substantially fit the curved bottom edge.

6. The apparatus of claim 4, further comprising:
a circuit board electrically coupled to the probing tips through the circuitry film, wherein the top portion of the fixture is attached to the circuit board, and the bottom portion of the fixture passes through a through hole of the circuit board and extends toward the device-under-test.

7. The apparatus of claim 1, wherein the first portion of the circuitry film is detachably affixed to the top sidewall of the fixture through an engaging mechanism.

8. An apparatus for probing a device-under-test, comprising:
a fixture comprising a base and a protrusion, the protrusion connected to the base and extending toward the device-under-test;
a circuitry film attached to the fixture, the circuitry film comprising a first portion extending along a sidewall of the base of the fixture and a second portion extending across a bottom surface of the protrusion of the fixture;
a first signal connector disposed on and electrically connected to the first portion of the circuitry film; and
a plurality of probing tips disposed on the second portion of the circuitry film to probe the device-under-test, and the first signal connector being electrically coupled to the probing tips through the circuitry film, wherein the first signal connector and the probing tips extend toward different directions.

9. The apparatus of claim 8, wherein an extending direction of the first signal connector is substantially perpendicular to an extending direction of the probing tips.

10. The apparatus of claim 8, further comprising:
a circuit board electrically coupled to the probing tips through the circuitry film, wherein the base of the fixture is attached to the circuit board, and the protrusion of the fixture passes through a through hole of the circuit board and extends toward the device-under-test.

11. The apparatus of claim 10, further comprising:
a second signal connector extending between a third portion of the circuitry film and the circuit board, wherein the third portion of the circuitry film underlies the base of the fixture.

12. The apparatus of claim 11, wherein an extending direction of the first signal connector is different from that of the second signal connector.

13. The apparatus of claim 11, wherein the first signal connector is a radio frequency connector, and the second signal connector provides a signal transmission different from the first signal connector.

14. The apparatus of claim 8, wherein the base of the fixture comprises a curved bottom edge, and the circuitry film is bended to substantially fit a contour of the curved bottom edge of the fixture.

15. The apparatus of claim 8, wherein the first portion of the circuitry film is detachably affixed to the sidewall of the base of the fixture through an engaging mechanism.

16. A method for probing a device-under-test, comprising:
attaching a circuitry film to a fixture, wherein the fixture comprises a base and a protrusion connected to the base;
assembling a first signal connector onto a portion of the circuitry film that covers a sidewall of the base of the fixture;
attaching the fixture to a circuit board, wherein the base of the fixture is disposed on the circuit board and the protrusion of the fixture passing through a through hole of the circuit board; and
probing the device-under-test by a plurality of probing tips disposed on another portion of the circuitry film underlying the protrusion of the fixture, wherein an extending direction of the first signal connector is different from an extending direction of the probing tips.

17. The method of claim 16, wherein the circuitry film is flexible and attaching the circuitry film comprises:
bending the circuitry film to substantially fit a contour of the fixture.

18. The method of claim 16, wherein attaching the circuitry film comprises:
detachably affixing the portion of the circuitry film to the sidewall of the base of the fixture, wherein a conductive contact of the circuitry film is accessibly revealed for coupling the first signal connector.

19. The method of claim 16, wherein assembling the first signal connector comprises:
disposing the first signal connector along a direction substantially perpendicular to the sidewall of the base of the fixture; and
coupling the first signal connector to a conductive contact of the circuitry film.

20. The method of claim 16, wherein attaching the fixture to the circuit board comprises:
coupling a second signal connector on the circuitry film to a conductive contact on the circuit board, wherein the second signal connector is disposed in a gap between the base of the fixture and the circuit board.

\* \* \* \* \*